US006960819B2

(12) United States Patent
Chen et al.

(10) Patent No.: US 6,960,819 B2
(45) Date of Patent: Nov. 1, 2005

(54) SYSTEM AND METHOD FOR ONE-TIME PROGRAMMED MEMORY THROUGH DIRECT-TUNNELING OXIDE BREAKDOWN

(75) Inventors: Vincent Chen, Mission Viejo, CA (US); Henry Chen, Irvine, CA (US); Liming Tsau, Irvine, CA (US); Jay Shiau, Irvine, CA (US); Surya Battacharya, Irvine, CA (US); Akira Ito, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 09/739,752

(22) Filed: Dec. 20, 2000

(65) Prior Publication Data

US 2002/0074616 A1 Jun. 20, 2002

(51) Int. Cl.[7] .............................................. H01L 29/00
(52) U.S. Cl. ........................ 257/530; 257/532; 438/131; 438/467; 438/600
(58) Field of Search ................................ 257/529–530, 257/532–533, 536, 393, 299, 610; 438/131, 467, 600, 264, 957; 365/96, 225.7, 149–150, 189.01

(56) References Cited

U.S. PATENT DOCUMENTS

| 4,173,791 | A | * | 11/1979 | Bell ............................ 365/178 |
| 4,499,557 | A | * | 2/1985 | Holmberg et al. .......... 365/163 |
| 5,163,180 | A | | 11/1992 | Eltoukhy et al. |
| 5,480,828 | A | * | 1/1996 | Hsu et al. .................... 438/275 |
| 5,742,555 | A | | 4/1998 | Marr et al. |
| 5,748,025 | A | * | 5/1998 | Ng et al. ...................... 326/81 |
| 5,834,824 | A | * | 11/1998 | Shepherd et al. ........... 257/530 |
| 5,883,392 | A | | 3/1999 | Schuegraf ................... 257/530 |
| 5,949,712 | A | | 9/1999 | Rao et al. |
| 6,044,012 | A | | 3/2000 | Rao et al. .................... 365/182 |
| 6,096,580 | A | * | 8/2000 | Iyer et al. .................... 438/132 |
| 6,096,610 | A | * | 8/2000 | Alavi et al. ................. 438/286 |
| 6,184,726 | B1 | * | 2/2001 | Haeberli et al. ............. 327/96 |
| 6,266,269 | B1 | * | 7/2001 | Karp et al. .................. 365/150 |
| 6,351,425 | B1 | * | 2/2002 | Porter ....................... 365/225.7 |
| 6,515,344 | B1 | | 2/2003 | Wollesen |
| 6,549,458 | B1 | * | 4/2003 | Rao et al. ............. 365/185.08 |
| 6,836,000 | B1 | * | 12/2004 | Marr et al. .................. 257/530 |
| 2001/0022746 | A1 | * | 9/2001 | Kim et al. ................... 365/200 |

OTHER PUBLICATIONS

Shi, Y., et al. "Polarity–Dependent Tunneling Current and Oxide Breakdown in Dual–Gate CMOSFET's", *IEEE Electron Device Letters* 19:391–393, (Oct. 1998).
International Search Report for PCT/US01/48853, Issued by the EPO on Jul. 31, 2002.
Schroder, Dieter K., "Semiconductor Material and Device Characterization", Fig. E6.5(a), Oxide failure modes, John Wiley & Sons, Inc., 2$^{nd}$ Edition, p. 391, (1998).
Schroder, Dieter K., "Semiconductor Material and Device Characterization", Fig. 6.40, Charge–to–breakdown as a function of oxide thickness, John Wiley & Sons, Inc., 2$^{nd}$ Edition, p397, (1998).
Clark, Lawrence T., "A High–Voltage Output Buffer Fabricated on a 2V CMOS Technology," *Symposium on VLSI Circuits Digest of Technical Papers*, pp. 61–62, (1999).

* cited by examiner

*Primary Examiner*—Tom Thomas
*Assistant Examiner*—José R. Diaz
(74) *Attorney, Agent, or Firm*—Sterne, Kessler, Goldstein & Fox P.L.L.C.

(57) ABSTRACT

A one-time programming memory element, capable of being manufactured in a 0.13 μm or below CMOS technology, having a capacitor, or transistor configured as a capacitor, with an oxide layer capable of passing direct gate tunneling current, and a switch having a voltage tolerance higher than that of the capacitor/transistor, wherein the capacitor/transistor is one-time programmable as an anti-fuse by application of a voltage across the oxide layer via the switch to cause direct gate tunneling current to thereby rupture the oxide layer to form a conductive path having resistance of approximately hundreds of ohms or less.

20 Claims, 7 Drawing Sheets

FIG. 5A
NMOS FET 10x10 um² S/D FLOAT

FIG. 5B
NMOS FET 10x10 um²

FIG. 7

SYSTEM AND METHOD FOR ONE-TIME PROGRAMMED MEMORY THROUGH DIRECT-TUNNELING OXIDE BREAKDOWN

BACKGROUND OF THE INVENTION

1. Field of the Invention

The present invention relates to integrated circuits, and more specifically to a CMOS non-volatile memory circuit.

2. Related Art

In the field of data storage, there are two main types of storage elements. The first type is volatile memory that has the information stored in a particular storage element and the information is lost the instant the power is removed from the circuit. The second type is a non-volatile storage element in which the information is preserved even with the power removed. Of the second type, some designs allow multiple programming while other designs allow one-time programming. Typically, the manufacturing techniques used to form non-volatile memory are quite different from a standard logic processes, thereby dramatically increasing the complexity and chip size.

Complimentary Metal Oxide Semiconductor (CMOS) technology is the integration of both NMOS and PMOS transistors on a silicon substrate. The NMOS transistor consists of a N-type doped polysilicon gate, a channel conduction region, and source/drain regions formed by diffusion of N-type dopant in the silicon substrate. The channel region separates the source from the drain in the lateral direction, whereas a layer of dielectric material that prevents electrical current flow separates the polysilicon gate from the channel. Similarly, the architecture is the same for the PMOS transistor but a P-type dopant is used.

The dielectric material separating the polysilicon gate from the channel region, henceforth referred to as the gate oxide, usually consists of the thermally grown silicon dioxide ($SiO_2$) material that leaks very little current through a mechanism called Fowler-Nordheim tunneling under voltage stress. When stressed beyond a critical electrical field (applied voltage divided by the thickness of the oxide), the transistor is destroyed by rupturing of the oxide.

Thin oxides that allow direct tunneling current behave quite differently than thicker oxides, which exhibit Fowler-Nordheim tunneling. Rupturing thin oxide requires consideration for pulse width duration and amplitude to limit power through the gate oxide to produce reliable, low resistance anti-fuse.

Rupturing the gate oxide is a technique used to program a non-volatile memory array. U.S. Pat. No. 6,044,012 discloses a technique for rupturing the gate oxide, but the oxide is about 40 Å to 70 Å thick. The probability of direct tunneling, rather than Fowler-Nordheim tunneling, of gate current through an oxide of this thickness is extremely low. Also, the voltage required to rupture the oxide is substantially higher and requires a charge pump circuit. The '012 patent does not disclose final programmed resistance, but such is believed to be in the high kilo (K) ohms range.

U.S. Pat. No. 5,886,392 discloses a one-time programmable element having a controlled programmed state resistance with multiple anti-fuses. Both the final resistance values are high in the K-ohms range and the spread of these values is wide as well. Again, a complicated circuit would have to be designed if the final resistance is not within a tight range. Adding more anti-fuses can lower the resistance but increases the die size.

What is needed is a one-time programmable CMOS circuit and method that is compatible with non-volatile memory array architecture for sub 0.13 µm process technology.

SUMMARY OF THE INVENTION

The present invention provides a one-time programmable non-volatile memory structure that is fabricated using standard 0.13 µm CMOS process technology. The invention uses a core CMOS anti-fuse transistor having a source region and a drain region that are commonly tied to ground in a capacitor configuration. The anti-fuse transistor is programmed by applying a high programming voltage to its gate, thereby rupturing the gate oxide of the transistor. The oxide is about 20 Å thick, which allows direct tunneling current and yields an after-programmed resistance on the order of a few hundred ohms or less, which is an order of magnitude lower then conventional one-time programmable anti-fuses. Voltage to rupture gate oxide can be adjusted depending on the programming time pulse and final resistance spread requirement.

In one embodiment, the anti-fuse transistor is enclosed in a deep N-well structure, which allows the surrounding deep N-well to be biased at a different voltage to isolate the memory cell. In this embodiment, the gate can be programmed at a lower voltage than without a deep N-well enclosure.

In another embodiment, the state of the anti-fuse transistor is programmed through a 5-volt tolerant circuitry and read through a 1.2-volt sensing circuit.

In yet another embodiment, the anti-fuse transistor can be used as a fixed low-resistance resistor, connected in series or in parallel to achieve the desired resistance.

These and other objects, advantages and features will become readily apparent in view of the following detailed description of the invention.

BRIEF DESCRIPTION OF THE FIGURES

The features and advantages of the present invention will become more apparent from the detailed description set forth below when taken in conjunction with the drawings in which like reference numbers indicate identical or functionally similar elements. Additionally, the left-most digit of a reference number identifies the drawing in which the reference number first appears.

Finally.

DETAILED DESCRIPTION OF THE PREFERRED EMBODIMENTS

The term anti-fuse and the terms storage or programmable coupled with the terms cell, element, or device are often used interchangeably in this field. The present invention is applicable to all the above as they are generally understood in the field.

According to the present invention, the physical current used to rupture (also referred to as "breakdown") an oxide is dominated by a different mechanism than in prior art anti-fuses fabricated according to 0.35 µm and 0.18 µm process technologies. In the present invention, the oxide rupture can be more controlled and the final programmed resistance is much lower than conventional devices. A smaller variance on programmed resistance allows a more compact circuit design to determine the state of the memory cell. Moreover, the lower voltage required to rupture the anti-fuse oxide means no charge pump circuitry is required, thus making a simpler memory array design and smaller circuit area requirement.

Controlling the programmed state resistance is a disadvantage of conventional anti-fuses. For example, one conventional programmed anti-fuse may have a resistance of a few kilo ohms, while a neighboring anti-fuse on the same IC may have a resistance in the range of 10 to 100 kilo ohms. The present invention avoids this problem. The programmed state resistance varies minimally between anti-fuses made according to the present invention.

Another disadvantage of the conventional anti-fuses is the instability of their programmed state resistance. Specifically, the resistance of the programmed anti-fuses tends to increase over time. In the worst case, the programmed anti-fuse may actually switch from the programmed state to the unprogrammed state resulting in circuit failure. The programmed state resistance of anti-fuses made according to the present invention is more stable over time compared to conventional anti-fuses.

Figure 1:
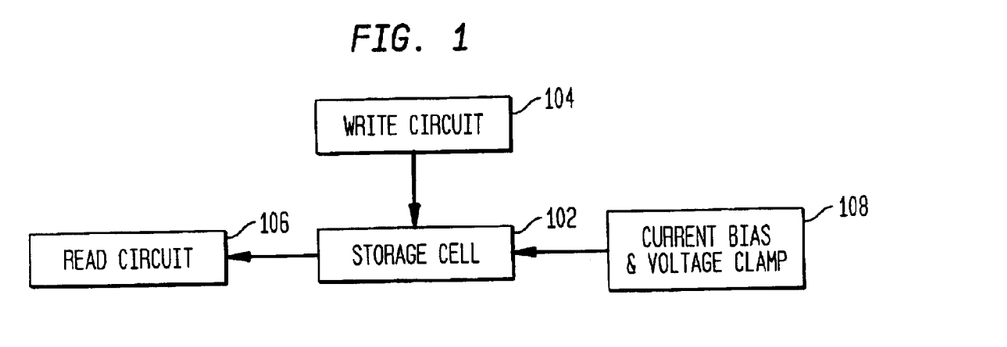
FIG. 1 illustrates a block diagram of a one-time programmable storage cell and ancillary circuitry, according to the present invention.

FIG. 1 illustrates a block diagram of a one-time programmable storage cell and ancillary circuitry, according to the present invention. The block diagram of FIG. 1 includes a storage cell 102, and a write circuit 104, a read circuit 106 and a current bias and voltage clamp circuit 108.

Figure 2:
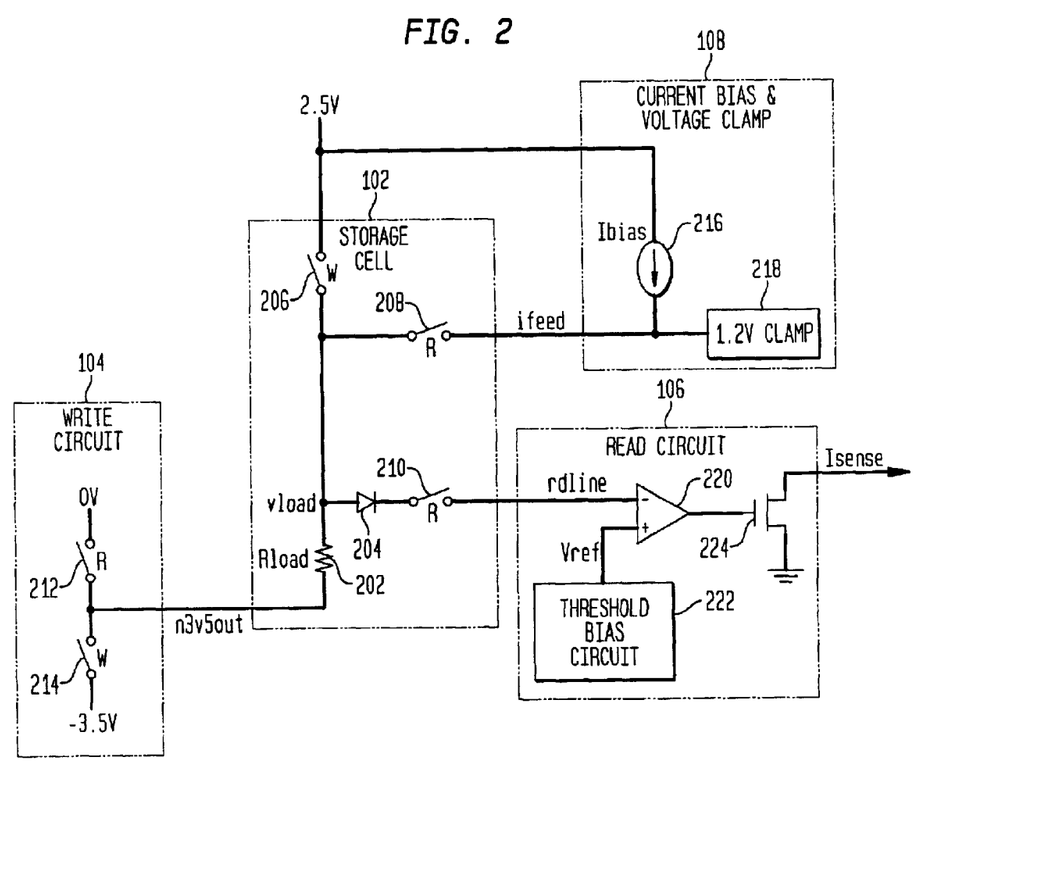
FIG. 2 illustrates a schematic diagram corresponding to FIG. 1.

FIG. 2 illustrates an example schematic diagram of an embodiment corresponding to FIG. 1. The storage cell 102 comprises a resistive load (Rload) 202, a diode 204, a write switch 206, and two read switches 208 and 210. Rload 202 is an ideal representation of an anti-fuse, comprising a capacitor or MOS transistor configured as a capacitor. In the latter instance, the source and drain of the transistor are coupled together to form one plate of the capacitor. The other plate is formed by the transistor gate, and the plates are separated by a gate oxide. The gate oxide layer is approximately 20 Å thick, which can be achieved with 0.13 µm or less process technology. This thickness is chosen so that the gate can be ruptured by direct tunneling gate current, rather than Fowler-Nordheim tunneling.

The diode 204, write switch 206 and read switches 208 and 210 can be implemented using transistors or the like, as would become apparent to a person skilled in the relevant art. The operation of these elements will be described below.

Write circuit 104 comprises a read switch 212 and a write switch 214 coupled in series between zero (i.e., ground) and negative 3.5-volt supplies. Current bias and voltage clamp circuit 108 comprises a current source 216 and a 1.2-volt clamp circuit 218 to provide a 2.5-volt supply to a node labeled "vload" of the storage cell 102. The current source 216 and a 1.2-volt clamp circuit 218 are coupled to a node, which in turn is coupled to read switch 208 via a connection labeled "ifeed".

Rload is coupled between the vload node and switches 212 and 214 via a connection labeled "n3v5out" (negative 3.5-volt out). Closing of write switches 206 and 214, while read switches 208, 210 and 212 remain open, permits sufficient current to flow through the vload node to rupture the anti-fuse. Once programmed in this manner, the anti-fuse can be read by read circuit 106. In this arrangement, write switch 206 must have a voltage tolerance higher than that of the anti-fuse. To achieve this higher voltage tolerance, the switches, including write switch 206, are formed with thicker gate oxide layers (e.g., 50–70 Å).

Read circuit 106 comprises an amplifier 220, threshold bias circuit 222 and an output sense transistor 224. The inverted input of amplifier 220 is coupled to switch 210 via a connection labeled "rdline". The non-inverted input of amplifier 220, which is labeled "Vref", is coupled to the threshold bias circuit 222. The output of amplifier 220 is coupled to the output sense transistor 224. With read switches 208, 210 and 212 closed, and write switches 214 and 206 open, the read circuit 106 compares the voltage at node vload to the reference voltage Vref. If the anti-fuse has been programmed, its resistance will be orders of magnitude lower than its un-programmed resistance. This difference in resistance is converted into a meaningful signal at the output of the read circuit labeled "Isense", as would become apparent to a person skilled in the relevant art based on the above description of the first embodiment.

Figure 3:
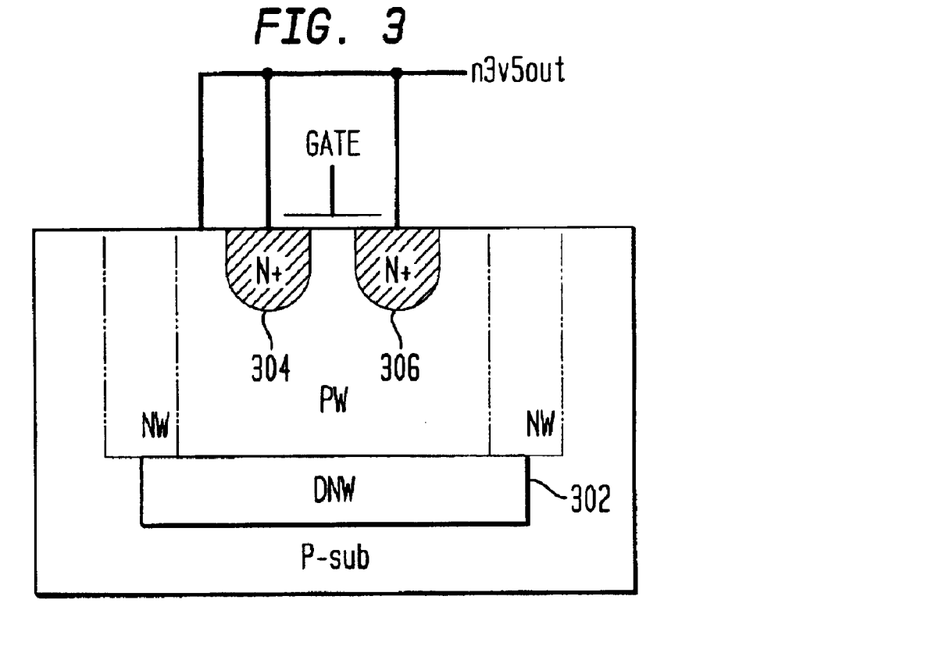
FIG. 3 illustrates a deep N-well MOSFET used to implement the main element of the storage cell, according to an embodiment of the present invention.

FIG. 3 illustrates a deep N-well MOSFET used to implement the anti-fuse of the storage cell, according to an embodiment of the present invention. The deep N-well is shown at 302. Coupling of source 304 and drain 306 is shown at the n3v5out connection. The gate is coupled to vload. This low voltage CMOS anti-fuse transistor is programmed by controlled pulses of electrical current with fixed amplitude to rupture its gate oxide. The electrical power through the gate oxide cannot exceed a certain voltage and duration as to avoid creating a void in the gate oxide. The advantage of the deep N-well is to isolate the memory cell and allow biasing of the well, source and drain to −3.5 volts when write switch 214 is closed. When write switch 206 is closed, 2.5 volts is applied to the gate through the vload, thus effectively creating a 6-volt voltage difference across the gate oxide to rupture it. When the gate oxide is destroyed, a conductive path is formed between the gate electrode and the source/drain regions of the anti-fuse transistor. This resistance, under controlled electrical pulses, will be in the hundreds of ohms range or less, which is 4 orders of magnitude lower than the resistance prior to programming. To apply the high programming voltage across the gate oxide of the anti-fuse transistor, the drain and source regions of the anti-fuse transistor are connected to ground, and a programming voltage is applied to the gate of the anti-fuse transistor as described above.

Figure 4:
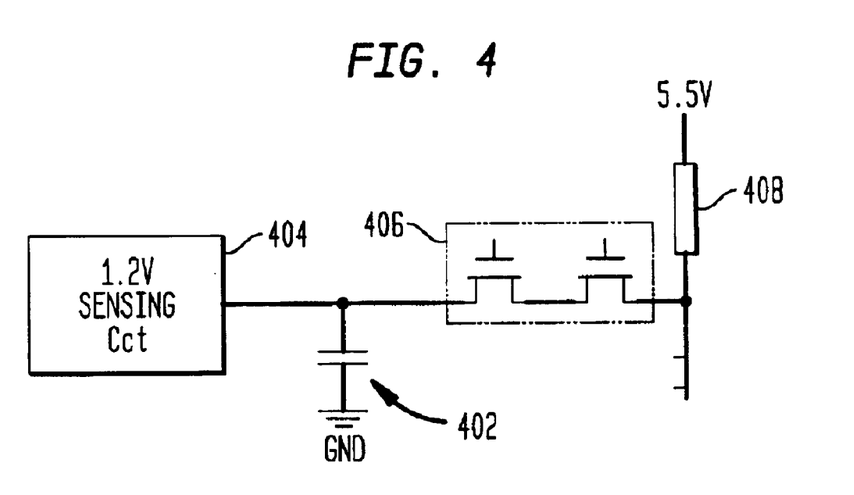
FIG. 4 illustrates another embodiment using 5-volt tolerant switches.

FIG. 4 illustrates another embodiment in which no deep N-well transistor is used. The transistor's gate (shown as capacitor 402) is tied to a 1.2-volt sensing circuit 404 and a 5-volt tolerant switch 406. The 5-volt tolerant switch 406 is constructed from Input/Output MOS devices having a thicker gate oxide. An example 5-volt tolerant switch that can be used to implement this alternative embodiment of the present invention is described in "A High-Voltage Output Buffer Fabricated on a 2 V CMOS Technology", by L. T. Clark, 1999 Symposium on VLSI Circuits Digest of Technical Papers (June 1999). These thicker gate oxide devices are connected to a resistor 408, whose other end is tied to the 5-volt supply. By appropriate switching, as would become apparent to a person skilled in the relevant art based on the above description of the first embodiment, the oxide is ruptured to program the anti-fuse.

Figure 5A:
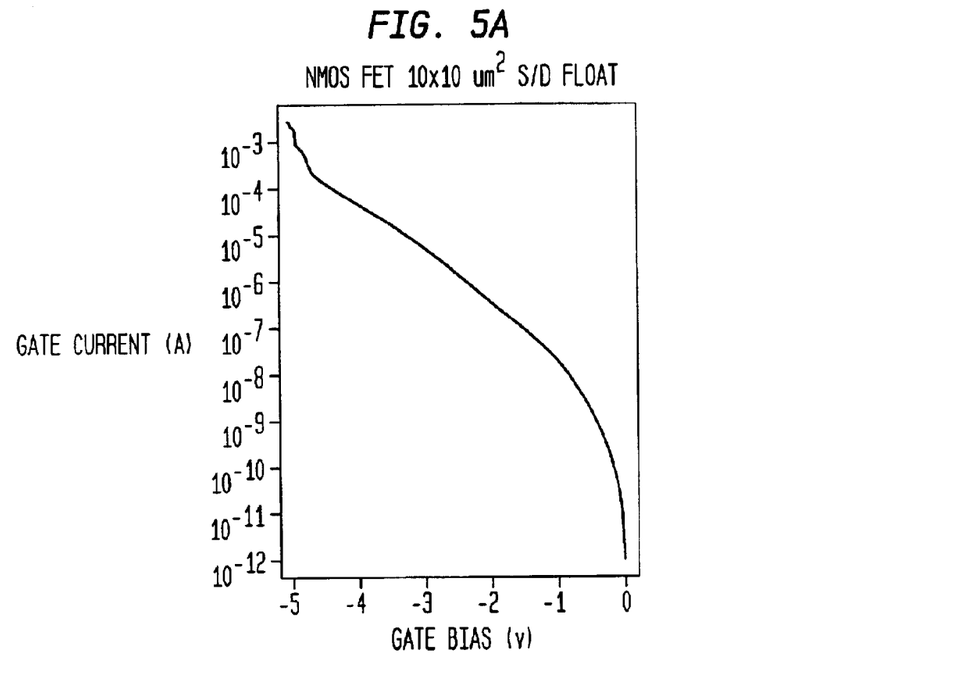
FIGS. 5A and 5B are graphs showing data corresponding to the breakdown characteristics of the gate oxide, according to the present invention.
Figure 5B:
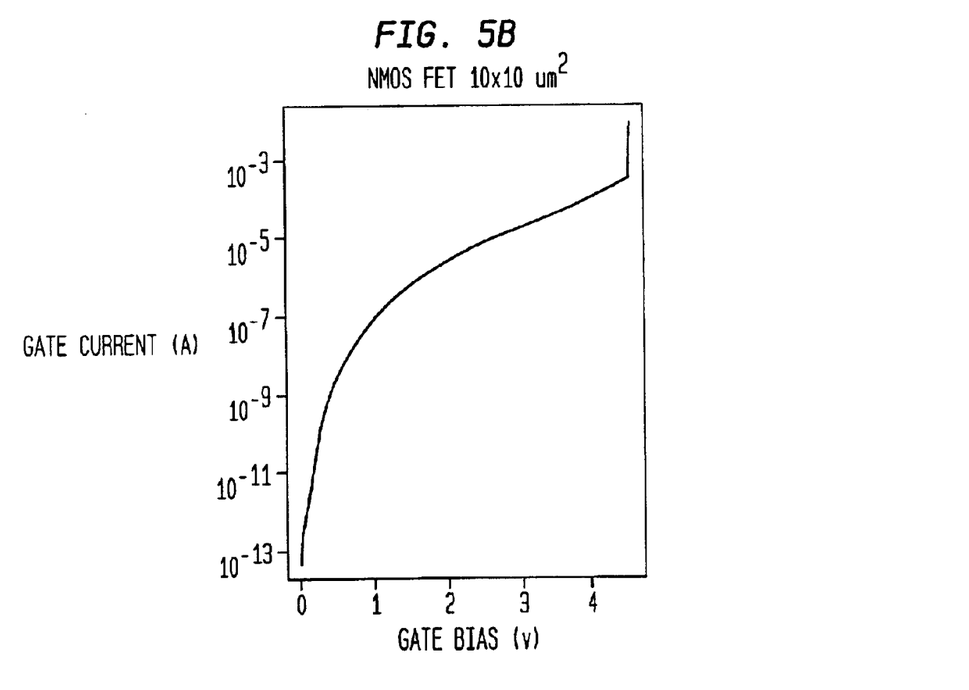

FIGS. 5A and 5B are graphs showing data corresponding to the breakdown characteristics of the gate oxide, according to the present invention. Two configurations are shown. FIG. 5A shows breakdown characteristic with source and drain floating (i.e., not biased). FIG. 5B shows the same breakdown characteristic with the source and drain terminals tied to the well. As more clearly indicated in FIG. 5B, the breakdown voltage of the gate oxide is about 4.6 volts.

Figure 6A:
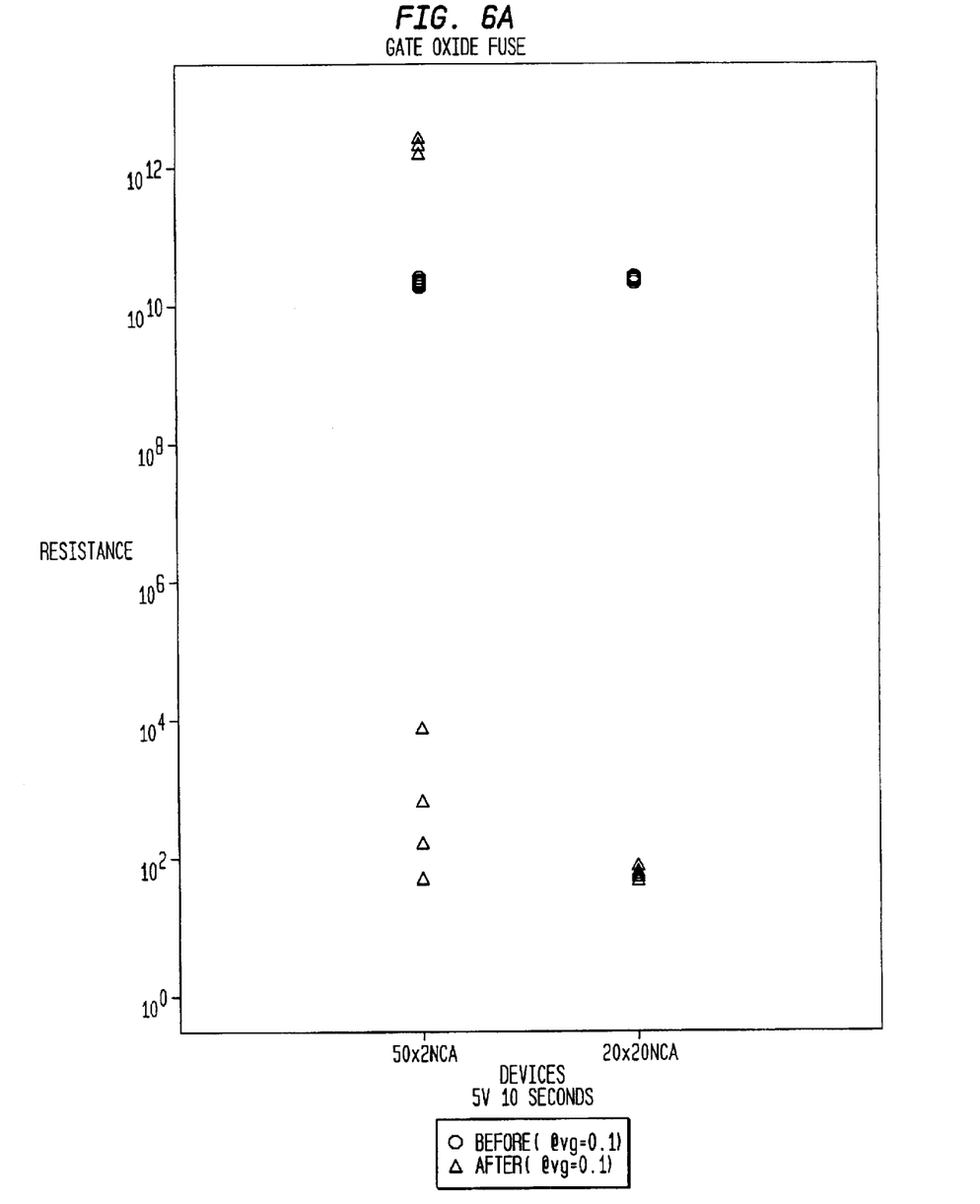
FIGS. 6A and 6B show example data resulting from programming the anti-fuse transistors, according to the present invention.
Figure 6B:
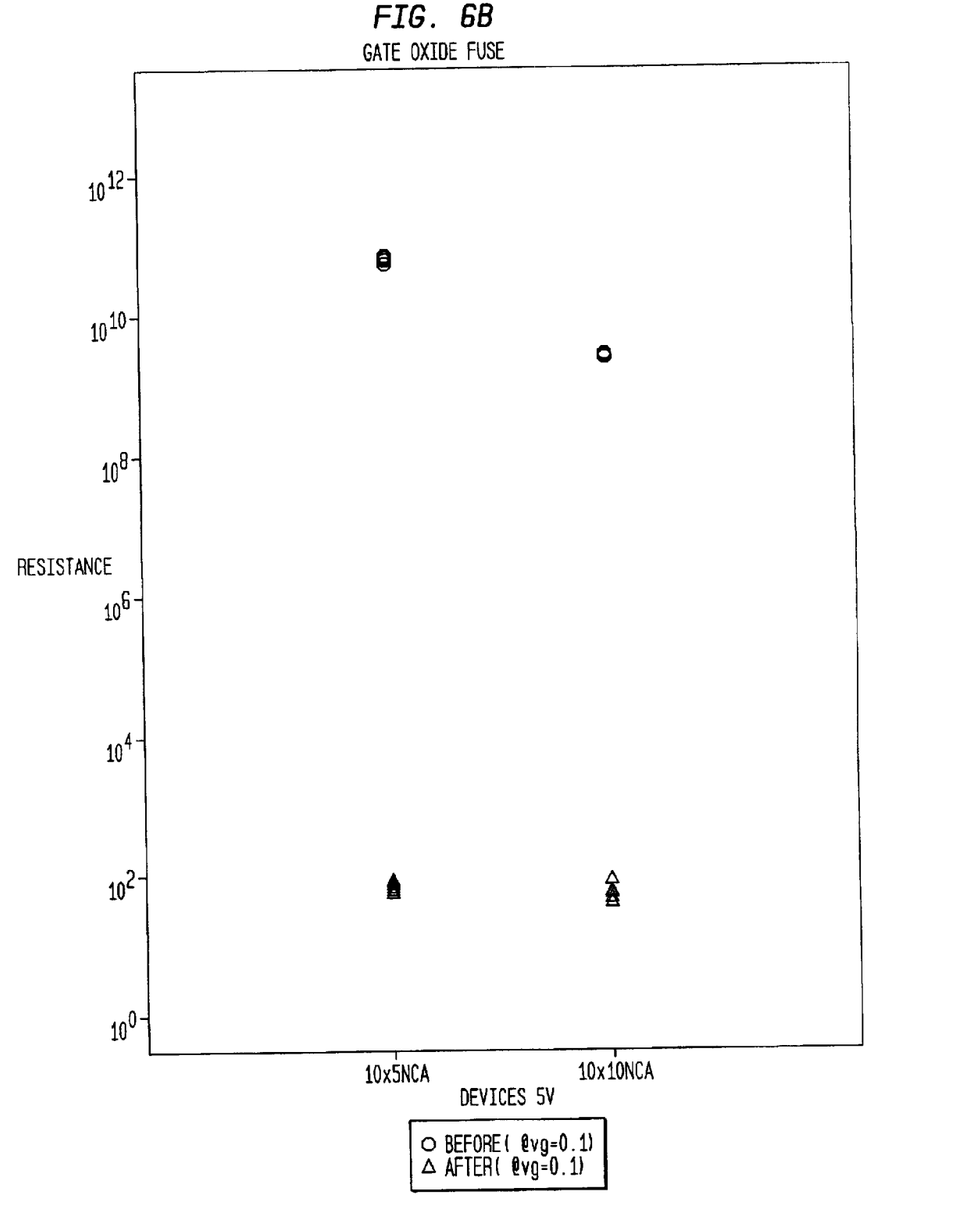

FIGS. 6A and 6B show example data resulting from programming the anti-fuse transistors using about 5 volts and reading its resistance by applying 0.1 volts on the gate electrode with the grounded source/drain regions. The tight distribution of the programmed anti-fuse resistance makes the determination of its state quite easy. The 5-volt programming supply can be from the system power bus, which eliminates the need to integrate charge pump circuitry on the same chip. Data for gate dimensions of 10×10 $\mu$m versus 50×2 $\mu$m are illustrated. These geometries are provided by way of example and not limitation. Other geometries within the scope of the invention are contemplated by the inventors.

Figure 7:
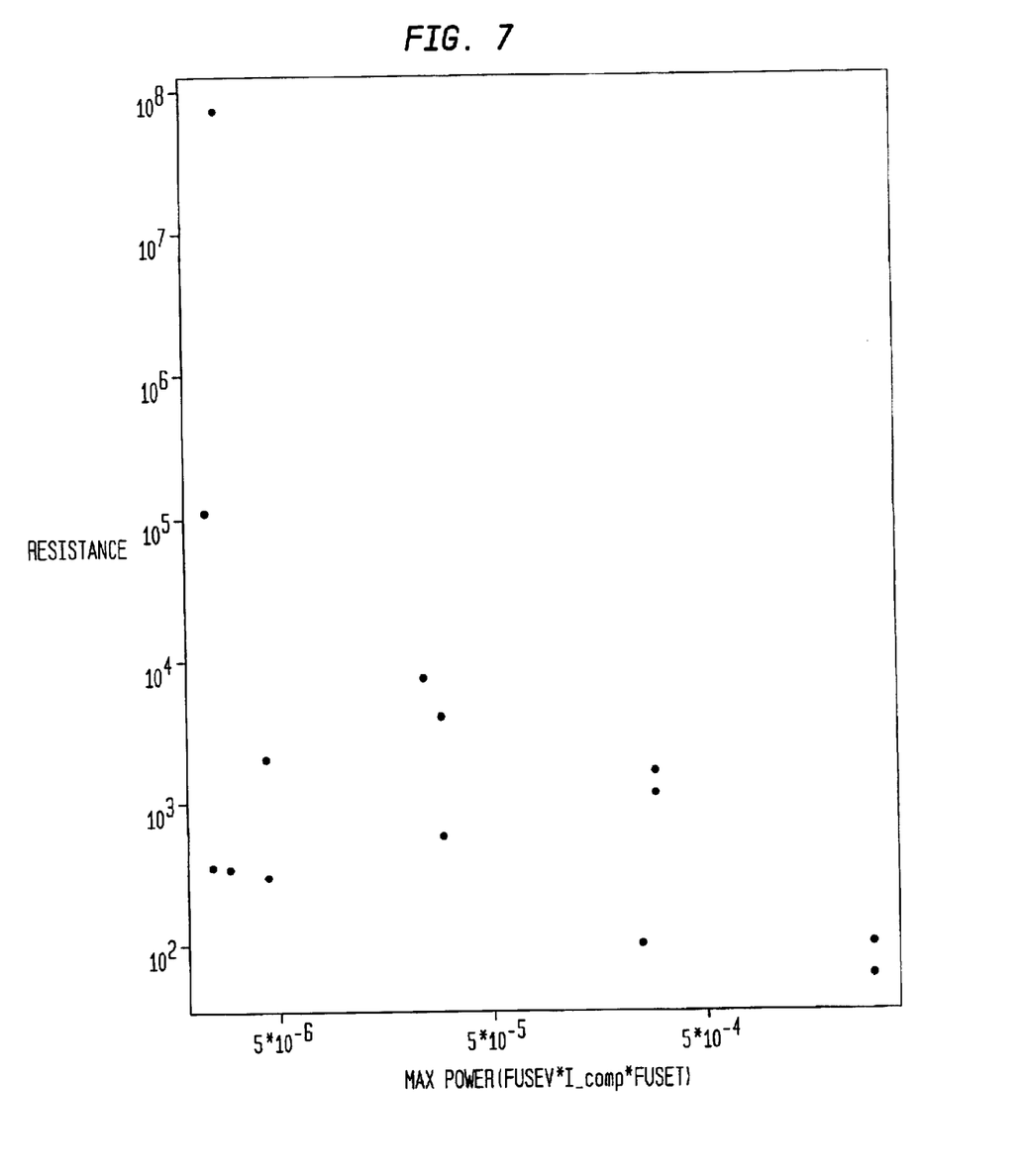
FIG. 7 illustrates a plot of the final (after programming) anti-fuse resistance versus applied power, according to the present invention.

Finally, FIG. 7 illustrates a plot of the final (after programming) anti-fuse resistance versus applied power. The power is defined as Power=FuseV*I compliance*Time, as was applied by an HP4156b (Hewlett-Packard Company, Palo Alto, Calif.). The HP4156b is a precision semiconductor parameter analyzer used to vary three parameters for testing purposes: voltage, time duration and current compliance. HP4156b output voltage for the time duration specified and the clamp current (output to no more than the current compliance specified) when current starts to flow through the oxide layer is illustrated.

Conclusion

An advantage of the present invention is the compact nature of the non-volatile one-time programmable gate oxide capacitor manufactured using standard 0.13 $\mu$m CMOS process, which exhibits direct gate tunneling current. Thus, integrating multitudes of anti-fuses on a single IC can be achieved according to the present invention.

One intended use is in the area of post package programming to install security codes. The codes cannot be electrically altered or decoded without destroying the circuitry. Alternatively, the anti-fuse capacitor/transistor can be used as memory elements in programmable logic devices and read only memory devices.

Reliability of the anti-fuse transistor and its final programmed state makes one hundred percent reliability possible.

Controlling the programmed state resistance of a one-time programming element is also possible according to the present invention. A four-order of magnitude difference in resistance is yielded before and after programming. This makes the circuitry design easier and more compact because the low programmed resistance, tighter resistance spread, and little or no resistance variation with time.

Programming voltage is low and usually available directly from system bus. Thus, the present invention eliminates charge pump circuitry on chip.

The present invention may be implemented with various changes and substitutions to the illustrated embodiments. For example, the present invention may be implemented on substrates comprised of materials other than silicon, such as, for example, gallium arsenide or sapphire.

It will be readily understood by those skilled in the art and having the benefit of this disclosure, that various other changes in the details, materials, and arrangements of the materials and steps which have been described and illustrated in order to explain the nature of this invention may be made without departing from the principles and scope of the invention as expressed in the subjoined claims.

What is claimed is:

1. A one-time programming memory element, capable of being manufactured in a 0.13 $\mu$m or below CMOS technology, comprising:

a capacitor having an oxide layer capable of passing direct gate tunneling current;

a write switch including a first switch transistor coupled between a first voltage and a first terminal of said capacitor and a second switch transistor coupled between a second voltage and a second terminal of said capacitor, said first and second switch transistors each having a gate oxide layer that is thicker than said capacitor oxide layer so as to have a voltage tolerance higher than that of said capacitor oxide layer, wherein closing said first and second switch transistors causes application of a voltage across said capacitor oxide layer; and a read switch including plural transistors coupled to said capacitor, each read switch transistor having a gate oxide layer that is thicker than said capacitor oxide layer so as to have a voltage tolerance higher than that of said capacitor oxide layer;

wherein said capacitor is one-time programmable as an anti-fuse by application of said voltage across said capacitor oxide layer via said write switch transistors to cause direct gate tunneling current to rupture said capacitor oxide layer to form a conductive path having resistance of approximately hundreds of ohms or less.

2. The one-time programming memory element according to claim 1, wherein said capacitor oxide layer is approximately 20 Å thick.

3. The one-time programming memory element according to claim 1, wherein said capacitor comprises a field effect transistor having source and drain regions coupled to ground, a gate coupled to said write switch and a gate dielectric forming said oxide layer.

4. The one-time programming memory element according to claim 3, wherein said field effect transistor has a deep N-well design including:

a P-well layer adjacent the source and drain regions;

a deep N-well layer below the P-well layer; and a P-type substrate below the deep N-well layer.

5. The one-time programming memory element according to claim 1, wherein said write switch comprises a 5-volt tolerant switch of which said first and second switch transistors are 2.5-volt transistors with gate oxide layers that are thicker than said capacitor oxide layer, and wherein said voltage across said capacitor oxide layer is less than 7 volts.

6. The one-time programming memory element according to claim 1, further comprising a sensing circuit to sense whether said capacitor is programmed.

7. The one-time programming memory element according to claim 1, wherein in a charge pump is not required to program said anti-fuse.

8. The one-time programming element of claim 1, wherein said voltage applied across said capacitor oxide layer is less than 7 volts.

9. The one-time programming memory element of claim 1, wherein:

when said write switch transistors are closed and said read switch transistors are open, one-time programming occurs; and when said read switch transistors are closed and said write switch transistors are open, reading occurs.

10. A process, compatible with 0.13 $\mu$m or below CMOS technology, for making a one-time programming memory element, comprising the steps of:

forming a capacitor having an oxide layer capable of passing direct gate tunneling current;

forming a write switch including a first switch transistor coupled between a first voltage and a first terminal of said capacitor and a second switch transistor coupled between a second voltage and a second terminal of said capacitor, said first and second switch transistors each having a gate oxide layer that is thicker than said capacitor oxide layer so as to have a voltage tolerance higher than that of said capacitor oxide layer, wherein closing said first and second switch transistors causes application of a voltage across said capacitor oxide layer; and forming a read switch including plural transistors each having a gate oxide layer that is thicker than said capacitor oxide layer so as to have a voltage tolerance higher than that of said capacitor oxide layer;

wherein said capacitor is one-time programmable as an anti-fuse, without a charge pump, by application of said voltage across said capacitor oxide layer via said write switch to cause direct gate tunneling current to rupture said capacitor oxide layer to form a conductive path having resistance of approximately hundreds of ohms or less.

11. The process according to claim 10, wherein said capacitor oxide layer is formed to a thickness of approximately 20 Å thick.

12. The process according to claim 10, wherein said forming a capacitor step comprises forming a field effect transistor having source and drain regions coupled to ground, a gate coupled to said write switch and a gate dielectric forming said oxide layer.

13. The process according to claim 12, wherein said forming a field effect transistor step further includes forming a deep N-well.

14. The process according to claim 10, wherein said forming write switch step comprises forming a 5-volt tolerance switch of which said first and second switch transistors are 2.5-volt transistors with gate oxide layers that are thicker than said capacitor oxide layer, and wherein said voltage across said capacitor oxide layer is less than 7 volts.

15. The process according to claim 10, further comprising the step of forming a sensing circuit to sense whether said capacitor is programmed.

16. The process according to claim 10, wherein said process does not require forming a charge pump to program said anti-fuse.

17. A one-time programming memory element, capable of being manufactured in a 0.13 $\mu$m or below CMOS technology, comprising:

a capacitor having an oxide layer, approximately 20 Å thick, capable of passing direct gate tunneling current;

a write switch including a first switch transistor coupled between a first voltage and a first terminal of said capacitor and a second switch transistor coupled between a second voltage and a second terminal of said capacitor, said first and second switch transistors each having a voltage tolerance higher than that of said capacitor, wherein closing said first and second switch transistors causes application of a voltage across said capacitor oxide layer; and a read switch including plural transistors coupled to said capacitor, each read switch transistor having a voltage tolerance higher than that of said capacitor;

wherein said capacitor is one-time programmable as an anti-fuse by application of said voltage across said oxide layer via said write switch to cause direct gate tunneling current to rupture said oxide layer to form a conductive path having resistance of approximately hundreds of ohms or less.

18. A one-time programming memory element, capable of being manufactured in a 0.13 $\mu$m or below CMOS technology, comprising:

a capacitor having an oxide layer capable of passing direct gate tunneling current;

a write switch including a first switch transistor coupled between a first voltage and a first terminal of said capacitor and a second switch transistor coupled between a second voltage and a second terminal of said capacitor, said first and second switch transistors each having a voltage tolerance higher than that of said capacitor, wherein closing said first and second switch transistors causes application of a voltage across said capacitor oxide layer; and a read switch including plural transistors coupled to said capacitor, each read switch transistor having a voltage tolerance higher than that of said capacitor;

wherein said capacitor is one-time programmable as an anti-fuse by application of said voltage across said oxide layer via said write switch to rupture said oxide layer to form a conductive path having a resistance of approximately hundreds of ohms or less;

wherein said capacitor comprises a field effect transistor having source and drain regions coupled to ground, a gate coupled to said write switch and a gate dielectric forming said oxide layer; and wherein said field effect transistor has a deep N-well design including:
a P-well layer adjacent the source and drain regions,
a deep N-well layer below the P-well layer, and
a P-type substrate below the deep N-well layer.

19. A one-time programming memory element capable of being manufactured in a 0.13 $\mu$m or below CMOS technology, comprising:

a transistor configured as a capacitor and having an oxide layer capable of passing direct gate tunneling current;

a write circuit, including:
a first switch transistor connected between a first terminal of said capacitor and a first voltage, and
a second switch transistor connected between a second terminal of said capacitor opposing said first terminal and a second voltage; and a read switch including plural transistors coupled to said capacitor;

wherein said capacitor is one-time programmable as an anti-fuse by application of a voltage, equal to a difference between said first and second voltages, across said oxide layer when said first and second switches are closed.

20. The one-time programming memory element of claim 19, wherein each of said first and second switch transistor has an oxide layer thicker than said capacitor oxide layer.

* * * * *